(12) United States Patent
Joshi et al.

(10) Patent No.: US 12,417,974 B2
(45) Date of Patent: Sep. 16, 2025

(54) DECOUPLING CAPACITANCE IN BACKSIDE INTERCONNECT

(71) Applicant: INTERNATIONAL BUSINESS MACHINES CORPORATION, Armonk, NY (US)

(72) Inventors: Rajiv Joshi, Yorktown Heights, NY (US); Nicholas Anthony Lanzillo, Wynantskill, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 498 days.

(21) Appl. No.: 18/051,028

(22) Filed: Oct. 31, 2022

(65) Prior Publication Data

US 2024/0145376 A1 May 2, 2024

(51) Int. Cl.
*H01L 23/522* (2006.01)
*H01L 21/3213* (2006.01)
*H01L 21/768* (2006.01)
*H01L 23/528* (2006.01)

(52) U.S. Cl.
CPC .... *H01L 23/5223* (2013.01); *H01L 21/32139* (2013.01); *H01L 21/76802* (2013.01); *H01L 21/76877* (2013.01); *H01L 21/76885* (2013.01); *H01L 23/5226* (2013.01); *H01L 23/5283* (2013.01)

(58) Field of Classification Search
CPC ........... H01L 23/5223; H01L 21/32139; H01L 21/76802; H01L 21/76877; H01L 21/76885; H01L 23/5226; H01L 23/5283; H01L 23/5286
See application file for complete search history.

(56) References Cited

U.S. PATENT DOCUMENTS

| | | |
|---|---|---|
| 5,935,868 A | 8/1999 | Fang |
| 6,570,210 B1 | 5/2003 | Sowlati |
| 6,960,529 B1 | 11/2005 | Nelson |
| 8,759,893 B2 | 6/2014 | Cho |
| 9,391,019 B2 | 7/2016 | Kobrinsky |
| 9,524,916 B2 | 12/2016 | Filippi |

(Continued)

OTHER PUBLICATIONS

Hossen et al., "Power Delivery Network (PDN) Modeling for Backside-PDN Configurations With Buried Power Rails and µTSVs", IEEE Transactions on Electron Devices, vol. 67, No. 1, Jan. 2020, pp. 11-17.

(Continued)

*Primary Examiner* — Karen Kusumakar
(74) *Attorney, Agent, or Firm* — Yuanmin Cai (57) ABSTRACT

Embodiments of present invention provide a semiconductor structure. The semiconductor structure includes a semiconductor chip having a frontside and a backside; a first metal level at the backside of the semiconductor chip; a second metal level above the first metal level; a plurality of damascene vias extending from the second metal level towards the first metal level; and a plurality of subtractive vias extending from the first metal level towards the second metal level, wherein the plurality of damascene vias and the plurality of subtractive vias are staggered to form an interdigitated comb-comb structure. A method of forming the semiconductor structure is also provided.

20 Claims, 12 Drawing Sheets (56) References Cited

U.S. PATENT DOCUMENTS

2023/0197612 A1* 6/2023 Majhi .................. H01L 23/481
          257/774
2023/0395506 A1* 12/2023 Reshotko .......... H01L 21/76843

OTHER PUBLICATIONS

Chipworks, "Intel Cherry Trail SR29W AtomTM Z8700 Microprocessor, Intel 14 nm SoC Tri-Gate HKMG CMOS Process", Advanced CMOS Essentials, ACE-1505-801, Aug. 17, 2015, 21 pages.
Tech Insights, "NVIDIA GV100-400-A1 TSMC 12FFN FinFET Process", Advanced CMOS Essentials, Mar. 26, 2018, 38 pages.

* cited by examiner

DECOUPLING CAPACITANCE IN BACKSIDE INTERCONNECT

BACKGROUND

The present application relates to manufacturing of semiconductor integrated circuits. More particularly, it relates to decoupling capacitance in backside interconnect and method of manufacturing the same.

As semiconductor industry moves towards smaller node, for example 5-nm node and beyond, field-effect-transistors (FETs) are aggressively scaled to fit into reduced footprint or real estate in a semiconductor wafer, which is often dictated by the node size, with increased device density. In addition, power supplies may be moved to a backside power distribution network (BSPDN) which is introduced as a mean to further increase the device density.

Generally, noises coming from power supplies are first filtered and possibly minimized through the use of decoupling capacitors before they are applied to power active devices. Conventionally, metal-insulator-metal (MIM) capacitors (caps) have been used as decoupling capacitors in order to increase decoupling capacitance in High performance computing (HPC) chips. With the introduction of backside power delivery system such as BSPDN, it would be advantageous to introduce additional decoupling capacitance.

SUMMARY

Embodiments of present invention provide a semiconductor structure. The semiconductor structure includes a semiconductor chip having a frontside and a backside; a first metal level at the backside of the semiconductor chip; a second metal level above the first metal level; a plurality of damascene vias extending from the second metal level towards the first metal level; and a plurality of subtractive vias extending from the first metal level towards the second metal level, wherein the plurality of damascene vias and the plurality of subtractive vias are staggered to form an interdigitated comb-comb structure.

In one embodiment, the plurality of damascene vias and the plurality of subtractive vias are unlanded damascene vias and unlanded subtractive vias respectively, and the plurality of damascene vias is separated from the plurality of subtractive vias by a dielectric layer.

In another embodiment, the plurality of damascene vias extends downwardly in a direction towards the semiconductor chip and the plurality of subtractive vias extends upwardly in a direction away from the semiconductor chip and, in a horizontal direction, the plurality of damascene vias partially overlaps with the plurality of subtractive vias.

In one embodiment, the first metal level further includes a first subtractive via and a second subtractive via in addition to the plurality of subtractive vias, and the second metal level further includes a first damascene via and a second damascene via in addition to the plurality of damascene vias, and at least the first damascene via is in contact with the first subtractive via.

In another embodiment, the first and second damascene vias and the first and second subtractive vias are in a backside-power-distribution-network (BSPDN) region and the plurality of damascene vias and the plurality of subtractive vias are in a backside capacitor region.

In yet another embodiment, the semiconductor chip includes at least one memory device; the first damascene via provides a source voltage Vss to the memory device through the first subtractive via; and the second damascene via provides a drain voltage Vdd to the memory device through the second subtractive via.

In one embodiment, the plurality of subtractive vias is formed by patterning a layer of a first conductive material into the plurality of subtractive vias through an etching process, and the plurality of damascene vias is formed by creating a plurality of via openings in a layer of dielectric material through a damascene patterning process and filling the plurality of via openings with a second conductive material to form the plurality of damascene vias.

Embodiments of present invention also provide a method of forming a semiconductor structure. The method includes forming a semiconductor chip that has a frontside and a backside; forming a first metal level at the backside of the semiconductor chip and a plurality of subtractive vias extending from the first metal level away from the semiconductor chip; and forming a second metal level on top of the first metal level and a plurality of damascene vias extending from the second metal level towards the semiconductor chip, wherein the plurality of damascene vias and the plurality of subtractive vias are staggered to form an interdigitated comb-comb structure.

In one embodiment, forming the first metal level and the plurality of subtractive vias includes depositing a first conductive layer at the backside of the semiconductor chip; forming a mask covering a first portion of the first conductive layer, the mask having a pattern of the plurality of subtractive vias; and etching partially into a second portion of the first conductive layer that is exposed by the mask, thereby transforming a top portion of the first conductive layer into the plurality of subtractive vias and a bottom portion of the first conductive layer into the first metal level.

In another embodiment, forming the second metal level and the plurality of damascene vias includes depositing a dielectric layer on top of the plurality of subtractive vias; forming a plurality of via openings and a trench on top of the plurality of via openings in the dielectric layer through a damascene patterning process; filling the plurality of via openings with a second conductive material to form the plurality of damascene vias; and filling the trench with the second conductive material to form the second metal level.

BRIEF DESCRIPTION OF THE DRAWINGS

The present invention will be understood and appreciated more fully from the following detailed description of embodiments of present invention, taken in conjunction with accompanying drawings of which:

FIG. 1 to FIG. 4 and FIGS. 5A, 5B to FIGS. 11A, 11B are demonstrative illustrations of different cross-sectional views of a semiconductor structure in steps of manufacturing thereof according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

Figure 1:
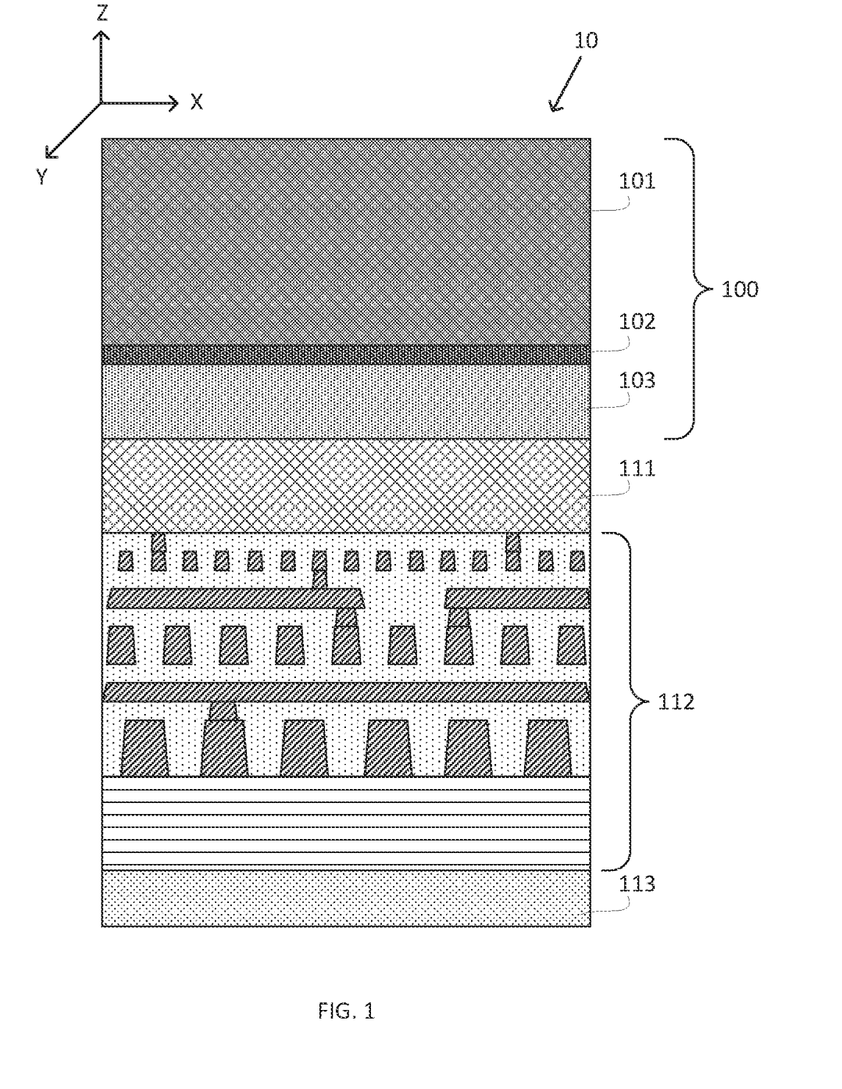

FIG. 1 is a demonstrative illustration of a cross-sectional view of a semiconductor structure 10 in a step of manufacturing thereof according to one embodiment of present invention. In particular, embodiments of present invention provide receiving a semiconductor substrate 100. As being demonstratively illustrated in FIG. 1 in an upside-down flipped fashion (for subsequent illustration purpose), the semiconductor substrate 100 may include a silicon layer 103 on top of a layer 102 which may be an etch-stop layer such as a layer of insulator (e.g., SiO2) or a layer of semiconductor (e.g., SiGe). The layer 102 may in-turn be on top of a bulk Si substrate 101. a bulk substrate 101 with an etch-stop layer 102 in-between.

Embodiments of present invention may provide forming a device layer 111 on top of the semiconductor substrate 100. The device layer 111 may be a front-end-of-line (FEOL) structure and may include various active devices such as, for example, transistors including fin-type field-effect-transistors and/or nanosheet transistors and various types of memories including, for example, static random-access memory (SRAM), resistive random-access memory (RRAM), and/or magnetoresistive random-access memory (MRAM). These active devices may require power supplies to power the devices and the power supplies may be provided through a backside-power-distribution-network (BSPDN). The device layer 111 may also include various passive devices such as resistors and/or metal-insulator-metal (MIM) capacitors.

Embodiments of present invention may further provide forming a back-end-of-line (BEOL) structure 112 on top of the device layer 111. The BEOL structure 112 may be formed to provide, for example and among others, power supply, device biasing, and signal routing functions to devices through a frontside of the device layer 111. Next, a carrier wafer 113 may be attached to the top of the BEOL structure 112, for example, through bonding. The semiconductor structure 10 formed thereby may subsequently be flipped upside-down, as being illustrated in FIG. 1, for further processing.

Figure 2:
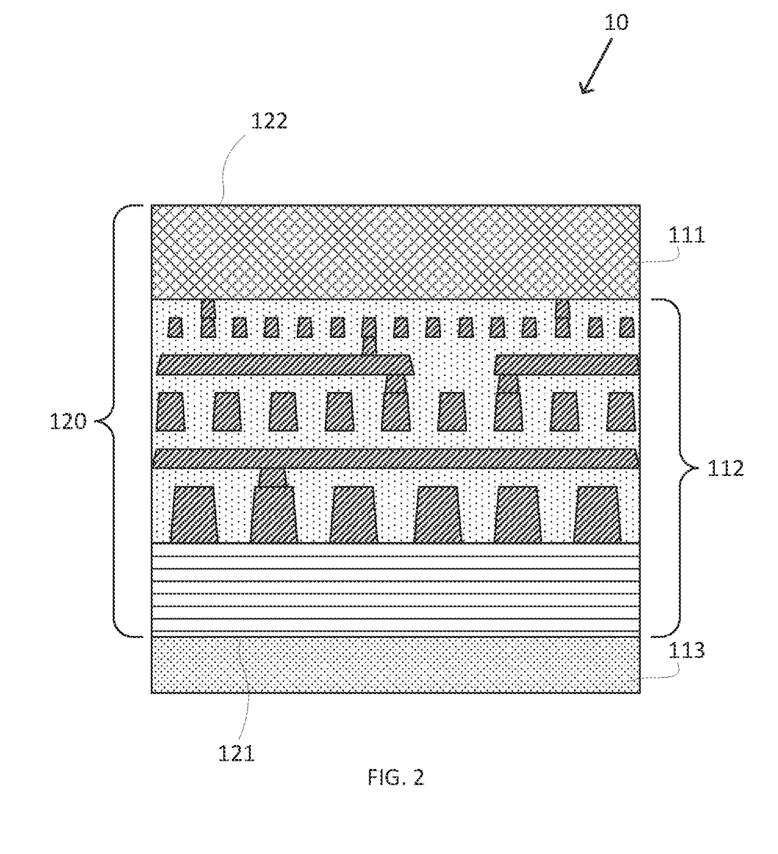

FIG. 2 is a demonstrative illustration of a cross-sectional view of the semiconductor structure 10 in a step of manufacturing thereof, following the step illustrated in FIG. 1, according to one embodiment of present invention. More particularly, embodiments of present invention provide removing the semiconductor substrate 100 to expose a backside of the device layer 111. For example, in removing the semiconductor substrate 100, embodiments of present invention may first remove the bulk substrate 101 through, for example, grinding and/or a chemical-mechanic-polishing (CMP) process until the layer 102 is exposed. Next, the layer 102, which may be an etch-stop layer, may be removed through for example a selectively etching process. After that, the silicon layer 103 may be removed for example through a selective Si removal process, with respect to the device layer 111.

The removal of the semiconductor substrate 100 from the backside of the device layer 111 may produce a semiconductor chip 120, as is illustrated in FIG. 2, that includes a frontside 121 and a backside 122. The frontside 121 of the semiconductor chip 120 may be the top surface of the BEOL structure 112, and the backside 122 of the semiconductor chip 120 may be the backside of the device layer 111.

Figure 3:
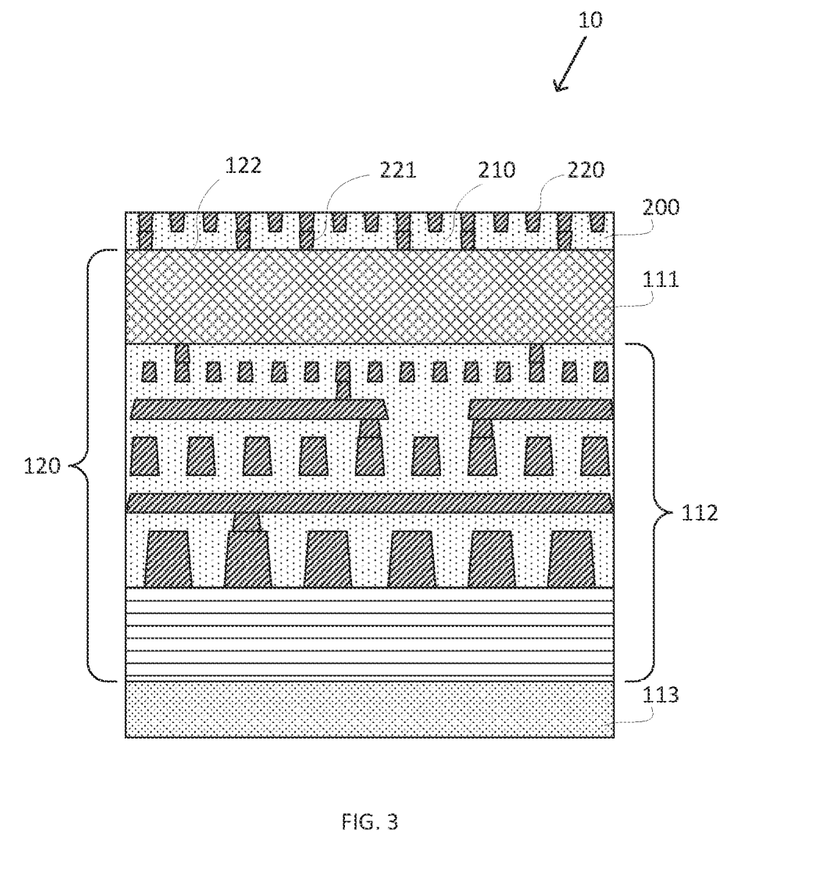

FIG. 3 is a demonstrative illustration of cross-sectional view of the semiconductor structure 10 in a step of manufacturing thereof, following the step illustrated in FIG. 2, according to one embodiment of present invention. More particularly, embodiments of present invention provide forming one or more interconnect wiring levels at the backside of the device layer 111, or more generally at the backside 122 of the semiconductor chip 120. For example, embodiment of present invention may provide forming an interconnect wiring level 200 that may include a metal level 220 and one or more backside contacts 221. The metal level 220, which may be for example a metal level-1 (M1), may be formed to be in contact with the one or more backside contacts 221. The one or more backside contacts 221 may in-turn be in contact with the active/passive devices in the device layer 111. The metal level 220 and the one or more backside contacts 221 may be embedded in a dielectric layer 210.

Figure 4:
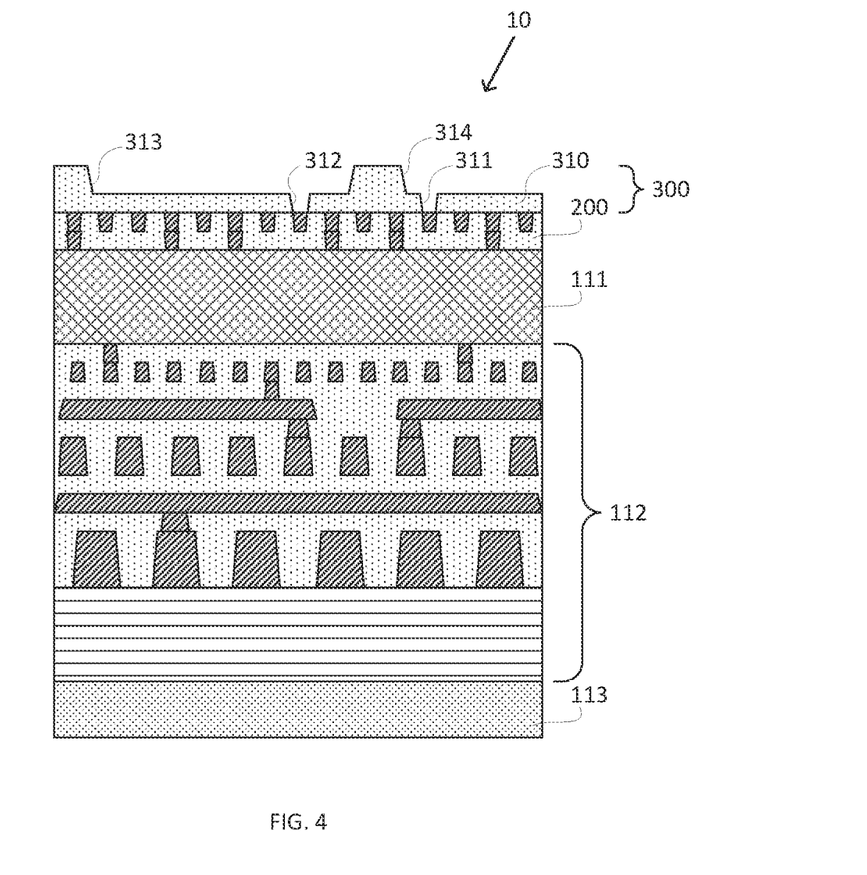

FIG. 4 is a demonstrative illustration of cross-sectional view of the semiconductor structure 10 in a step of manufacturing thereof, following the step illustrated in FIG. 3, according to one embodiment of present invention. More particularly, embodiments of preset invention provide forming an interconnect wiring level 300 on top of the interconnect wiring level 200. For example, embodiments of present invention provide first forming a dielectric layer 310 on top of the interconnect wiring level 200, and then performing a damascene patterning process to create openings in the dielectric layer 310. The openings may include one or more via openings, such as via openings 311 and 312, that may expose portions of the metal level 220 in the interconnect wiring level 200 and one or more trench openings, such as trench openings 313 and 314, for forming a metal level in the interconnect wiring level 300.

Figure 5A:
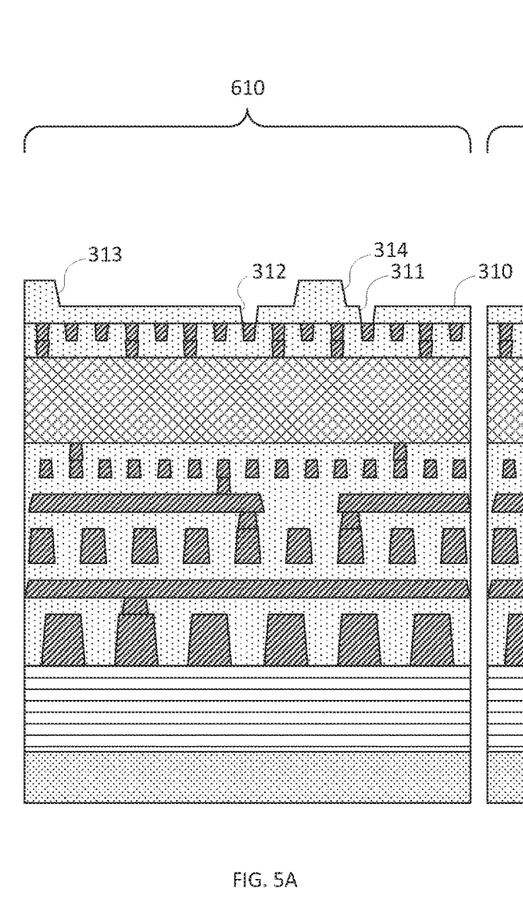
Figure 5B:
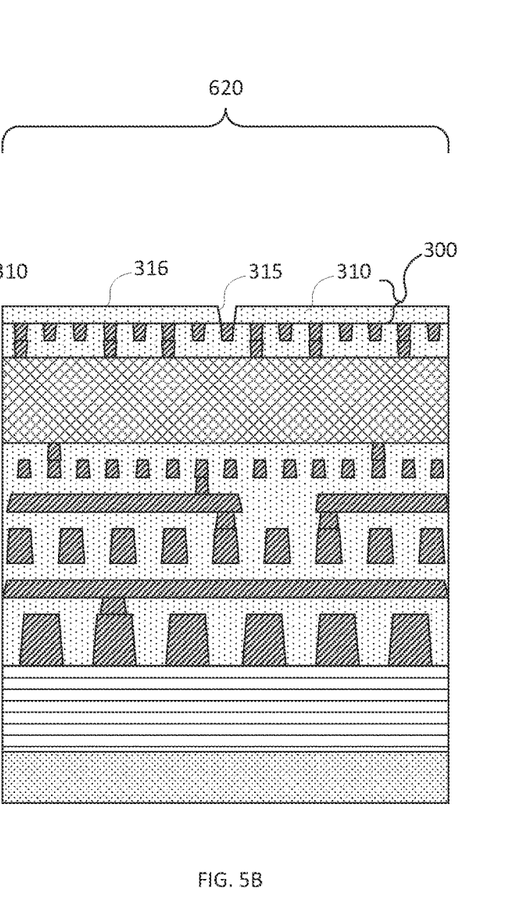

FIGS. 5A and 5B are demonstrative illustrations of different cross-sectional views of the semiconductor structure 10 in a step of manufacturing thereof, following the step illustrated in FIG. 3, according to one embodiment of present invention. More specifically, FIG. 5A is a re-production of FIG. 4, which demonstratively illustrates the cross-sectional view of the semiconductor structure 10 in a region 610 that contains backside-power-distribution network (BSPDN) and may be referred to as a BSPDN region 610. In the meantime, FIG. 5B is a demonstrative illustration of cross-sectional view of the semiconductor structure 10 in a region 620 that contains backside capacitors and may be referred to as a backside capacitor region 620.

More particularly, embodiments of present invention provide, during the process of forming the interconnect wiring level 300 in the BSPDN region 610, forming the same dielectric layer 310 in the backside capacitor region 620 and patterning the dielectric layer 310 in the same damascene patterning process that creates the via openings 311 and 312 and the trench openings 313 and 314 in the BSPDN region 610. The patterning creates one or more via openings such as a via opening 315 and one or more trench openings such as a trench opening 316 in the backside capacitor region 620 of the dielectric layer 310.

Figure 6A:
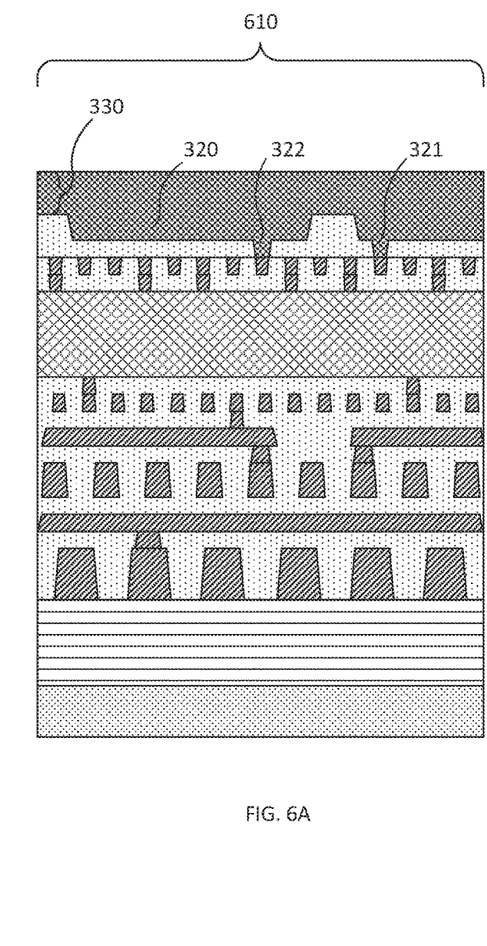
Figure 6B:
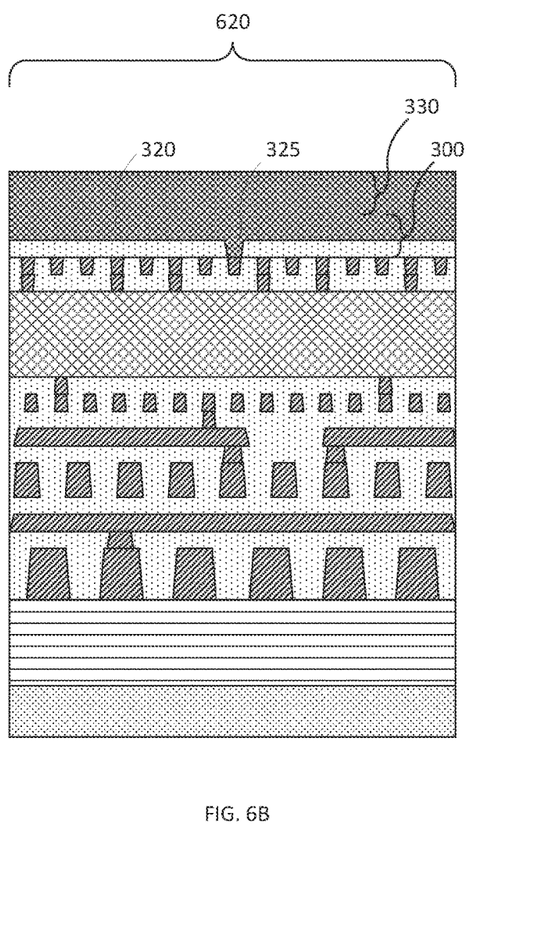

FIGS. 6A and 6B are demonstrative illustrations of different cross-sectional views of the semiconductor structure 10 in a step of manufacturing thereof, following the step illustrated in FIGS. 5A and 5B, according to one embodiment of present invention. More particularly, embodiments of present invention provide filling the via openings 311, 312 and 315 as well as the trench openings 313, 314 and 316 with a first conductive layer of conductive material such as, for example, Cu, Ru, Co, or W with a thin adhesion metal liner such as TiN or TaN to form via contacts 321, 322 and 325 in the via openings 311, 312 and 315 and a metal level 320 in the trench openings 313, 314 and 316. The first conductive layer may be deposited through a chemical-vapor-deposition (CVD) process, a physical-vapor-deposition (PVD) process, an atomic-layer-deposition (ALD) process, metal plating, and/or any other currently known or future developed means.

The first conductive layer may be deposited such that a lower portion of the first conductive layer may fill the via openings 311, 312 and 315 to form via contacts 321, 322 and 325 and the trench openings 313, 314 and 316 to form the metal level 320 in the dielectric layer 310. The first conductive layer may also include an upper portion thereof, i.e., a layer 330 above the interconnect wiring level 300 and on top of the metal level 320. The layer 330 may have a sufficient thickness to be used in forming one or more subtractive vias that extend upwardly from the metal level 320, as being described below in more details.

Figure 7A:
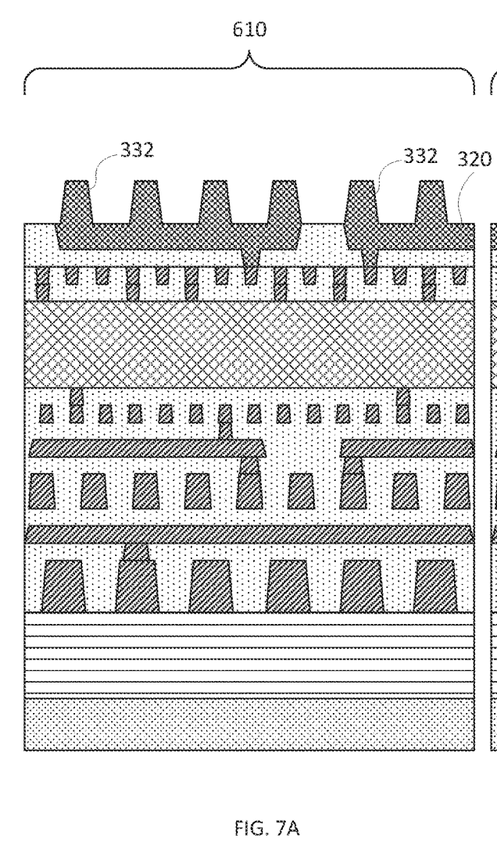
Figure 7B:
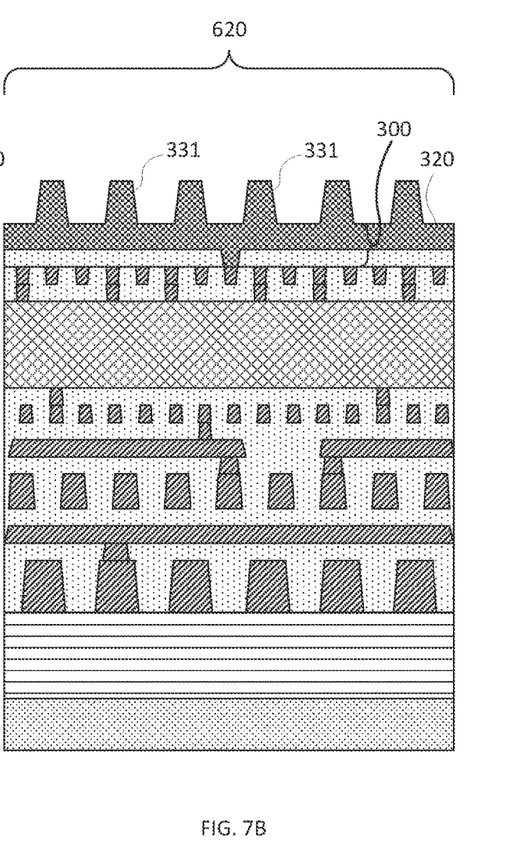

FIGS. 7A and 7B are demonstrative illustrations of different cross-sectional views of the semiconductor structure 10 in a step of manufacturing thereof, following the step illustrated in FIGS. 6A and 6B, according to one embodiment of present invention. More particularly, embodiments of present invention provide patterning the upper portion of the first conductive layer, i.e., the layer 330 in an etching process. The patterning transforms the layer 330 into a plurality of subtractive vias (or bars, or lines) 331 in the backside capacitor region 620 and a set of subtractive vias 332 in the BSPDN region 610. More specifically, in patterning the layer 330, embodiments of present invention provide first forming a mask having a pattern of the plurality of subtractive vias 331 to cover a first portion of the layer 330, and then etching a second portion of the layer 330 that are not covered and thus exposed by the mask. The etching therefore transforms the layer 330 into the plurality of subtractive vias 331 and the set of subtractive vias 332.

By virtue of etching the conductive material to form via, the subtractive vias 331 and 332 formed thereby may have a substantially trapezoidal shape with a smaller base at the top and thus above a larger base at the bottom as is illustrated in FIGS. 7A and 7B. The subtractive vias 331 and 332 extend upwardly from the metal level 320 in a direction away from the semiconductor chip 120, that is, away from the backside of the device layer 111. The metal level 320 may be a metal level-2 (M2), a metal level-3 (M3), or any other suitable metal levels.

Figure 8A:
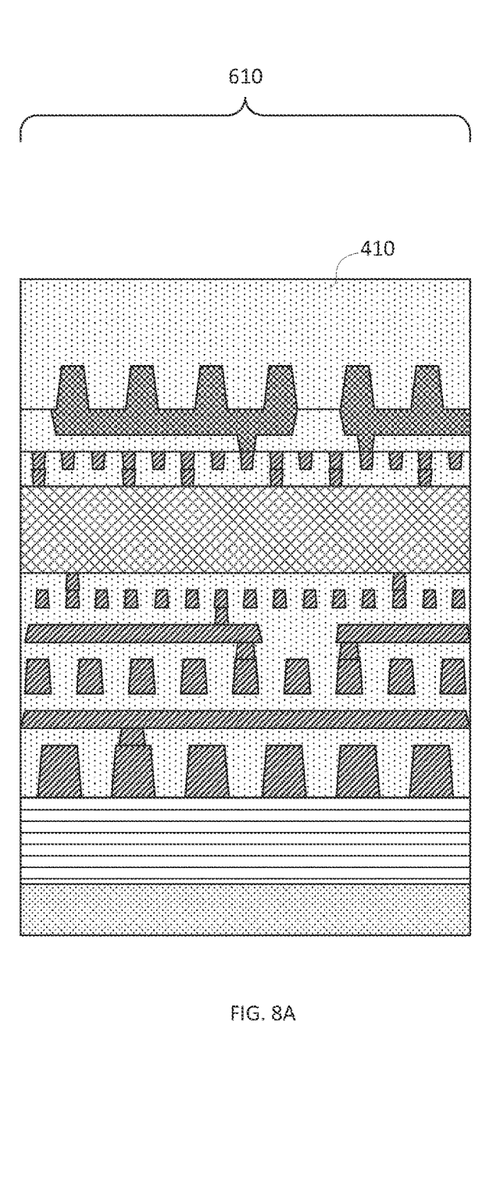
Figure 8B:
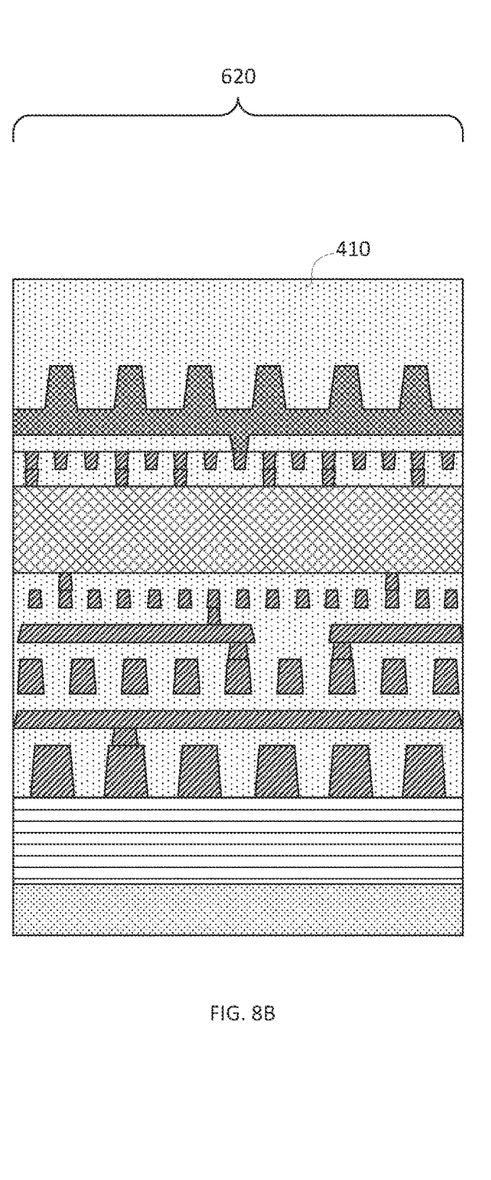

FIGS. 8A and 8B are demonstrative illustrations of different cross-sectional views of the semiconductor structure 10 in a step of manufacturing thereof, following the step illustrated in FIGS. 7A and 7B, according to one embodiment of present invention. More particularly, embodiments of preset invention provide forming a dielectric layer 410 covering the plurality of subtractive vias 331 in the backside capacitor region 620 and covering the set of subtractive vias 332 in the BSPDN region 610. An interconnect wiring level may later be formed, to be next to or adjacent to the interconnect wiring level 300, in the dielectric layer 410 to include a metal level and a plurality of via contacts, as being described below in more details.

Figure 9A:
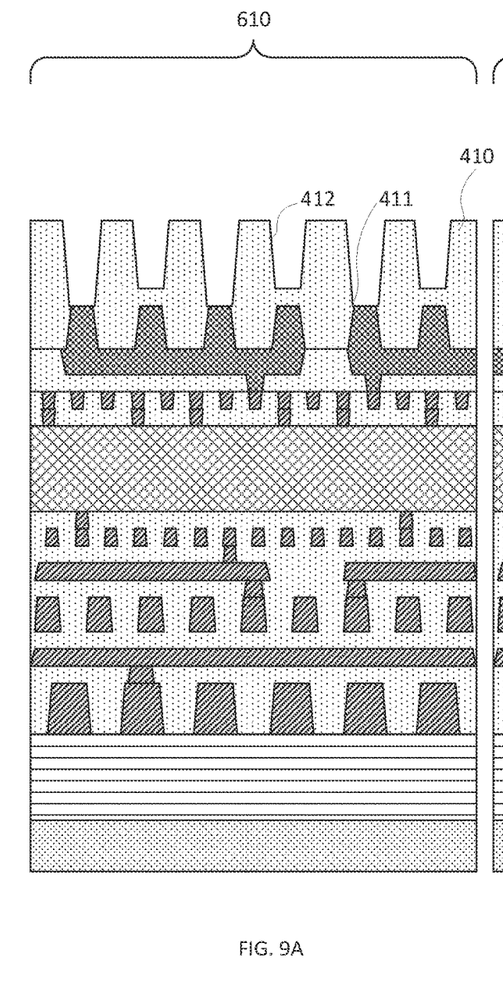
Figure 9B:
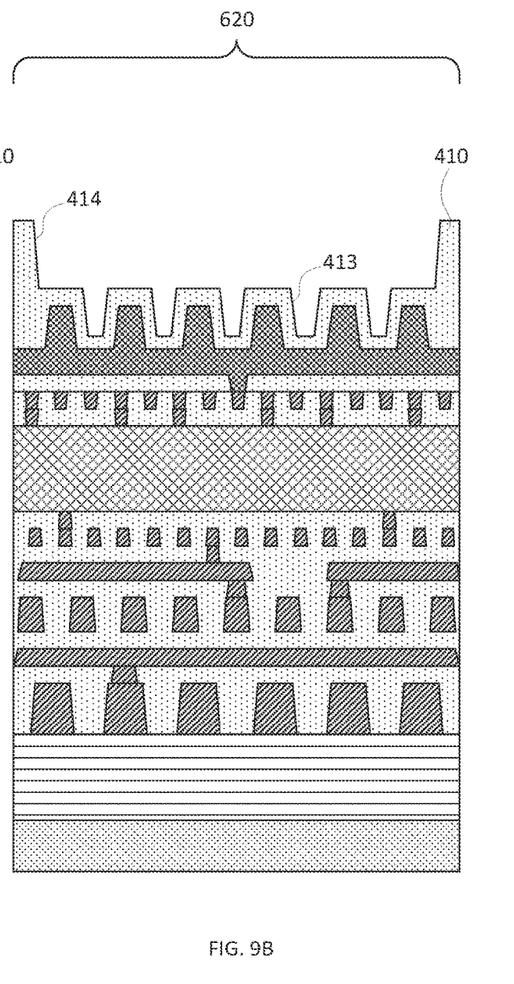

FIGS. 9A and 9B are demonstrative illustrations of different cross-sectional views of the semiconductor structure 10 in a step of manufacturing thereof, following the step illustrated in FIGS. 8A and 8B, according to one embodiment of present invention. More particularly, embodiments of present invention provide patterning the dielectric layer 410 through a damascene patterning process to create one or more via openings 411 that expose one or more of the subtractive vias 332 in the BSPDN region 610. The patterning also creates one or more trench openings 412 in the dielectric layer 410 that are not deep enough to expose the underneath subtractive vias 332 in the BSPDN region 610. It is noted here that some of the trench openings 412 may be made to overlap with the one or more via openings 411.

Embodiments of present invention may also provide forming one or more via openings 413 in the backside capacitor region 620 in the dielectric layer 410. The one or more via openings 413 may be staggered with the plurality of subtractive vias 331 and may extend into the dielectric layer 410 in an area between the subtractive vias 331. However, according to embodiments of present invention, the via openings 413 may not be made wide enough to expose sidewalls of the subtractive vias 331 and may not be made deep enough to expose the top surface of the metal level 320 that the subtractive vias 331 extend from. In other words, sidewalls of the subtractive vias 331 may be covered by at least a portion of the dielectric layer 410.

Embodiments of present invention may further provide forming one or more trench openings such as, for example, trench opening 414 in the dielectric layer 410 in the backside capacitor region 620. The trench opening 414 may overlap with the one or more via openings 413 and may be formed to have a depth substantially the same as depths of the trench openings 412 in the BSPDN region 610. In fact, for example, the trench openings 412 and the trench opening 414 may be formed during a same selective etching process. Trench opening 414 may not be formed deep enough to expose any of the underneath subtractive vias 331 and may leave at least a portion of the dielectric layer 410 covering the top of the subtractive vias 331. In one embodiment, the portion of the dielectric layer 410 covering the subtractive vias 331 may be in a conformal shape or form.

Figure 10A:
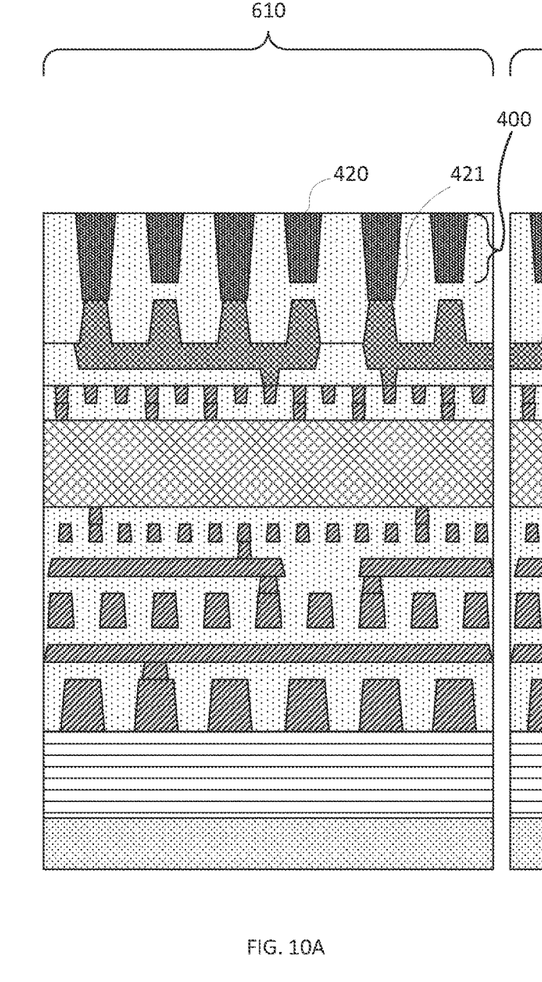
Figure 10B:
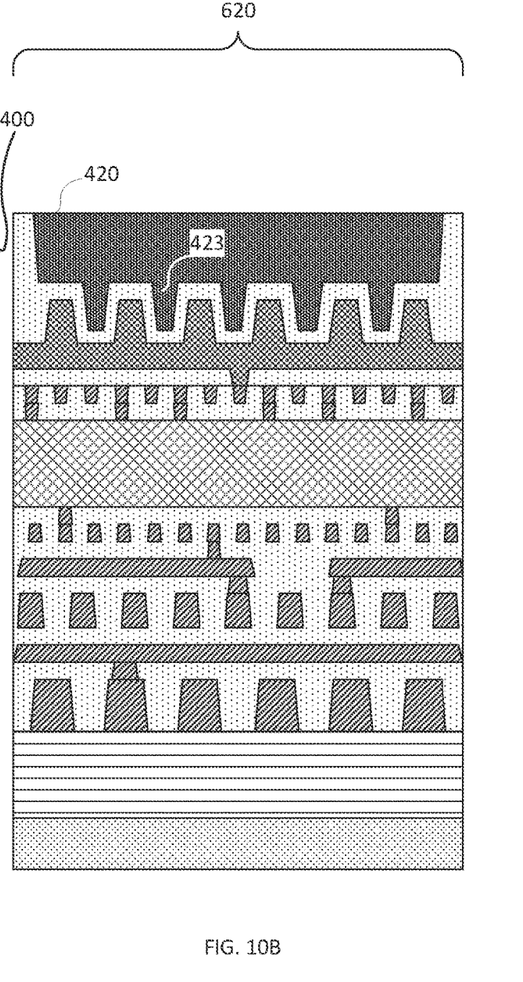

FIGS. 10A and 10B are demonstrative illustrations of different cross-sectional views of the semiconductor structure 10 in a step of manufacturing thereof, following the step illustrated in FIGS. 9A and 9B, according to one embodiment of present invention. More particularly, embodiments of present invention provide filling the via openings 411 with a second conductive material to form one or more damascene vias 421 and filling the trench openings 412, including trench openings above the via openings 411, with the second conductive material to form a metal level 420, thereby forming an interconnect wiring level 400 that includes the metal level 420. The one or more damascene vias 421 may extend downwardly from the metal level 420 in a direction towards the semiconductor chip 120 or towards the backside of the device layer 111. For example, a first and a second damascene vias 421 may be in contact with a first and a second subtractive vias 332. The metal level 420 formed thereby may be next to or adjacent to the metal level 320. For example, the metal level 420 may be a M3, and the metal level 320 may be a M2. In other words, the interconnect wiring level 400 may be adjacent to the interconnect wiring level 300 with no other interconnect wiring levels in-between. However, embodiments of present invention are not limited in this aspect and the metal level 420 may be a M4 and the metal level 320 may be a M3.

In one embodiment, power supplies may be provided to one or more active devices, such as a memory device, in the device layer 111 through the first and second damascene vias 421 to the first and second subtractive vias 332, which in-turn may be connected to the one or more backside contacts 221 through intervening contact vias and/or metal levels. For example, when the device layer 111 includes a SRAM memory device, power supplies such source voltage Vss and drain voltage Vdd may be provided to the SRAM memory through the first and second damascene via 421.

Embodiments of present invention further provide filling the plurality of via openings 413 in the backside capacitor region 620 with the second conductive material to form a plurality of damascene vias 423 and the metal level 420 from which the plurality of damascene vias 423 may extend downwardly towards the semiconductor chip 120 or the backside of the device layer 111. By virtue of forming vias through filling via openings, and the via openings are created through an etching process, the damascene vias 421 and 423 formed thereby may have a substantially trapezoidal shape or form with a larger base at the top and above a smaller base at the bottom. In other words, the damascene vias 421 and 423 may have a trapezoidal shape that is the trapezoidal shape of the subtractive vias 331 and 332 that is flipped upside-down.

The plurality of damascene vias 423 may be staggered with the subtractive vias 331 to form an interdigitated comb-comb structure. In a horizontal direction, the damascene vias 423 and the subtractive vias 331 may partially overlap with each other but not in touch with each other. In other words, the plurality of damascene vias 423 does not touch the metal level 320 and thus is a plurality of unlanded damascene vias. Similarly, the plurality of subtractive vias 331 does not touch the metal level 420 and thus is a plurality of unlanded subtractive vias. The damascene vias 423 and the subtractive vias 331 may be separated by at least a portion of the dielectric layer 410. In one embodiment, the dielectric material between the damascene vias 423 and the subtractive vias 331 may be in a serpentine shape and/or may be in a substantially conformal shape.

Figure 11A:
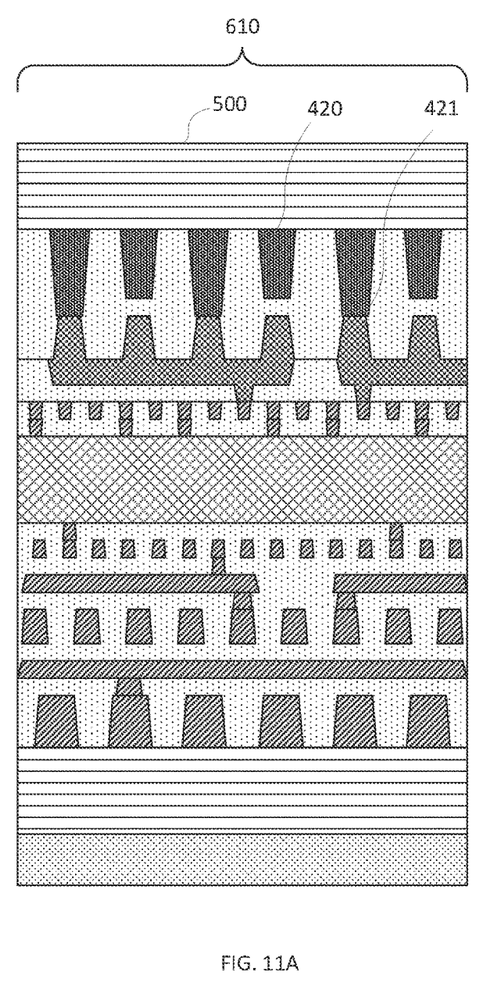
Figure 11B:
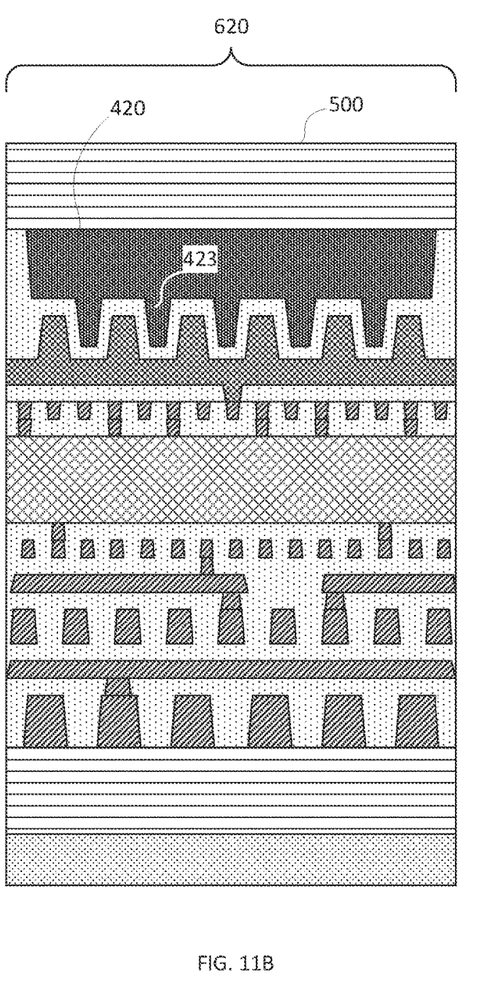

FIGS. 11A and 11B are demonstrative illustrations of different cross-sectional views of the semiconductor structure 10 in a step of manufacturing thereof, following the step illustrated in FIGS. 10A and 10B, according to one embodiment of present invention. More particularly, embodiments of present invention provide forming additional interconnect wiring levels 500 on top of the interconnect wiring level 400 including on top of the metal level 420 and the dielectric layer 410.

Figure 12:
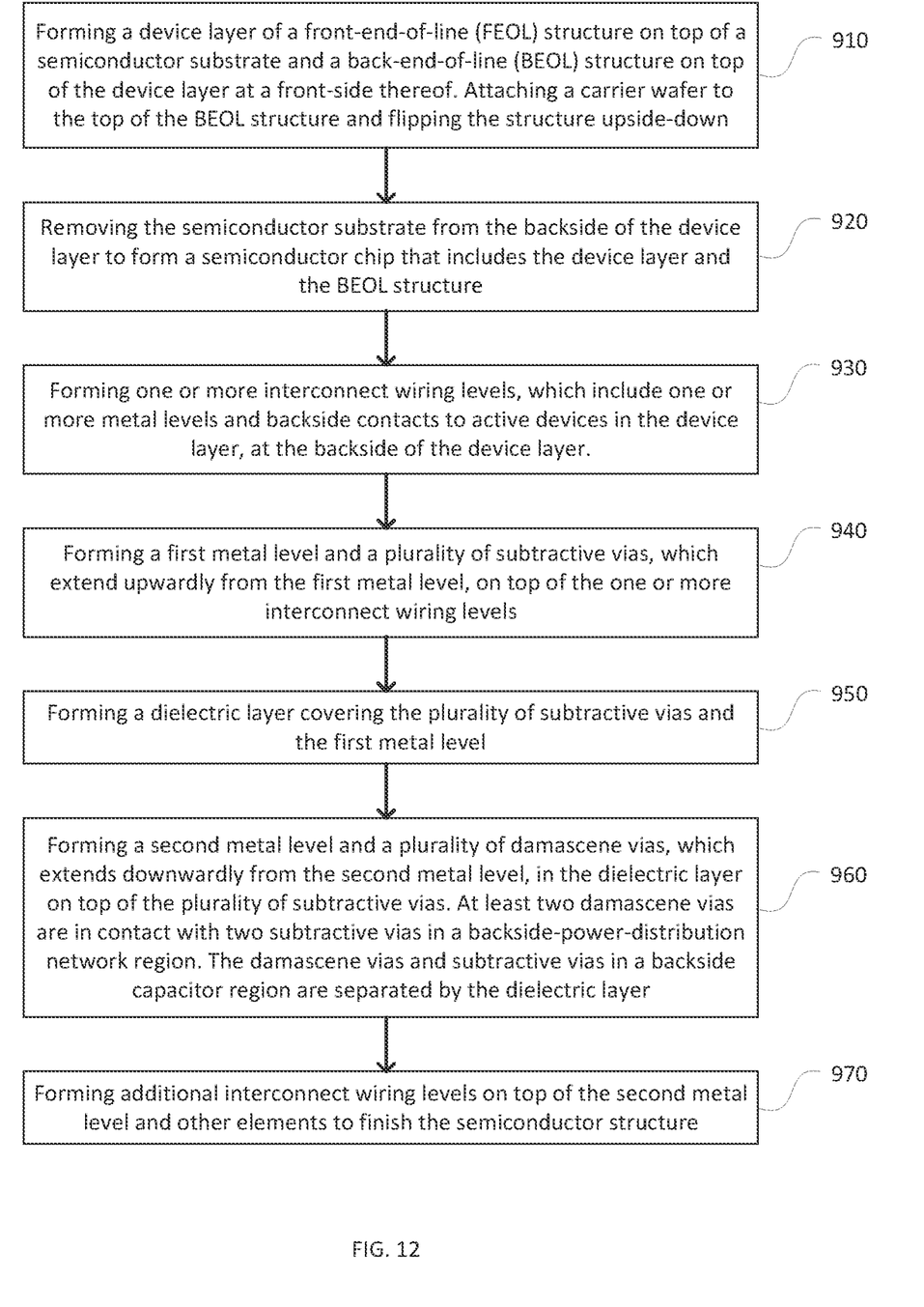
FIG. 12 is a demonstrative illustration of a flow-chart of a method of manufacturing a semiconductor structure according to embodiments of present invention.

FIG. 12 is a demonstrative illustration of a flow-chart of a method of manufacturing a semiconductor structure according to embodiments of present invention. The method includes (910) forming a device layer of a front-end-of-line (FEOL) structure on top of a semiconductor substrate; forming a back-end-of-line (BEOL) structure on top of the device layer at a frontside thereof, and attaching a carrier wafer such as through bonding onto the top of the BEOL structure, and flipping the formed structure upside-down; (920) removing the semiconductor substrate from the backside of the device layer thereby forming a semiconductor chip that includes the device layer and the BEOL structure; (930) forming one or more interconnect wiring levels at the backside of the device layer, where the one or more wiring levels may include one or more metal levels and backside contacts to active devices in the device layer; (940) forming a first metal level and a plurality of subtractive vias, which extend upwardly from the first metal level, on top of the one or more interconnect wiring levels; (950) forming a dielectric layer covering the plurality of subtractive vias and the first metal level; (960) forming a second metal level and a plurality of damascene vias, which extends downwardly from the second metal level, in the dielectric layer and on top of the plurality of subtractive vias. Here, one or more damascene vias in a backside-power-distribution-network (BSPDN) region may be in contact with one or more subtractive vias while in a backside capacitor region the plurality of damascene vias and the plurality of subtractive vias are separated by at least a portion of the dielectric layer; and (970) forming additional interconnect wiring levels on top of the second metal level and other device structures to finish forming the semiconductor structure.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
   a semiconductor chip having a frontside and a backside;
   a first metal level at the backside of the semiconductor chip;
   a second metal level above the first metal level;
   a plurality of damascene vias extending from the second metal level towards the first metal level; and
   a plurality of subtractive vias extending from the first metal level towards the second metal level,
   wherein the plurality of damascene vias and the plurality of subtractive vias are staggered to form an interdigitated comb-comb structure.

2. The semiconductor structure of claim 1, wherein the plurality of damascene vias and the plurality of subtractive vias are unlanded damascene vias and unlanded subtractive vias respectively, and wherein the plurality of damascene vias is separated from the plurality of subtractive vias by a dielectric layer.

3. The semiconductor structure of claim 2, wherein the plurality of damascene vias extends downwardly in a direction towards the semiconductor chip and the plurality of subtractive vias extends upwardly in a direction away from the semiconductor chip and, in a horizontal direction, the plurality of damascene vias partially overlaps with the plurality of subtractive vias.

4. The semiconductor structure of claim 1, wherein the first metal level further comprises a first subtractive via and a second subtractive via in addition to the plurality of subtractive vias, and the second metal level further comprises a first damascene via and a second damascene via in addition to the plurality of damascene vias, wherein at least the first damascene via is in contact with the first subtractive via.

5. The semiconductor structure of claim 4, wherein the first and second damascene vias and the first and second subtractive vias are in a backside-power-distribution-network (BSPDN) region and the plurality of damascene vias and the plurality of subtractive vias are in a backside capacitor region.

6. The semiconductor structure of claim 5, wherein the semiconductor chip includes at least one memory device; the first damascene via provides a source voltage Vss to the memory device through the first subtractive via; and the second damascene via provides a drain voltage Vdd to the memory device through the second subtractive via.

7. The semiconductor structure of claim 1, wherein the plurality of subtractive vias is formed by patterning a layer of a first conductive material into the plurality of subtractive vias through an etching process, the plurality of subtractive vias extending from a metal line of the first metal level, and the plurality of damascene vias is formed by creating a plurality of via openings in a layer of dielectric material through a damascene patterning process and filling the plurality of via openings with a second conductive material to form the plurality of damascene vias extending from a metal line of the second metal level.

8. A semiconductor structure comprising:
   a semiconductor chip having a frontside and a backside;
   a first metal level and a second metal level, with the second metal level being on top of the first metal level and both the first metal level and the second metal level being at the backside of the semiconductor chip;
   a plurality of damascene vias extending from the second metal level in a direction towards the semiconductor chip; and
   a plurality of subtractive vias extending from the first metal level in a direction away from the semiconductor chip,
   wherein the plurality of damascene vias and the plurality of subtractive vias, in a horizontal direction, partially overlap with each other to form an interdigitated comb-comb structure.

9. The semiconductor structure of claim 8, wherein the plurality of damascene vias is a plurality of unlanded damascene vias and the plurality of subtractive vias is a plurality of unlanded subtractive vias, further comprising a dielectric layer that separates the plurality of unlanded damascene vias from the plurality of unlanded subtractive vias.

10. The semiconductor structure of claim 8, wherein the first and second metal levels are within two adjacent interconnect wiring levels respectively.

11. The semiconductor structure of claim 8, wherein the first metal level further comprises a first subtractive via and a second subtractive via in addition to the plurality of subtractive vias, and the second metal level further comprises a first damascene via and a second damascene via in addition to the plurality of damascene vias, wherein the first damascene via is in contact with the first subtractive via and the second damascene via is in contact with the second subtractive via.

12. The semiconductor structure of claim 11, wherein the first and second damascene vias and the first and second subtractive vias are in a backside-power-distribution-network (BSPDN) region and the plurality of damascene vias and the plurality of subtractive vias are in a backside capacitor region.

13. The semiconductor structure of claim 11, wherein the semiconductor chip includes at least one memory device, and the first damascene via provides a source voltage Vss to the memory device through the first subtractive via, and the second damascene via provides a drain voltage Vdd to the memory device through the second subtractive via.

14. The semiconductor structure of claim 8, wherein each of the plurality of subtractive vias has a first trapezoidal shape with a smaller base above a larger base, and each of the plurality of damascene vias has a second trapezoidal shape with a larger base above a smaller base.

15. A method of forming semiconductor structure, the method comprising:
    forming a semiconductor chip that has a frontside and a backside;
    forming a first metal level at the backside of the semiconductor chip and a plurality of subtractive vias extending from the first metal level away from the semiconductor chip; and
    forming a second metal level on top of the first metal level and a plurality of damascene vias extending from the second metal level towards the semiconductor chip,
    wherein the plurality of damascene vias and the plurality of subtractive vias are staggered to form an interdigitated comb-comb structure.

16. The method of claim 15, wherein forming the first metal level and the plurality of subtractive vias comprises:
    depositing a first conductive layer at the backside of the semiconductor chip;
    forming a mask covering a first portion of the first conductive layer, the mask having a pattern of the plurality of subtractive vias; and
    etching partially into a second portion of the first conductive layer that is exposed by the mask, thereby transforming a top portion of the first conductive layer into the plurality of subtractive vias and a bottom portion of the first conductive layer into the first metal level.

17. The method of claim 16, wherein forming the second metal level and the plurality of damascene vias comprises:
    depositing a dielectric layer on top of the plurality of subtractive vias;
    forming a plurality of via openings and a trench on top of the plurality of via openings in the dielectric layer through a damascene patterning process;
    filling the plurality of via openings with a second conductive material to form the plurality of damascene vias; and
    filling the trench with the second conductive material to form the second metal level.

18. The method of claim 17, further comprising:
    forming a first via opening, in addition to the plurality of via openings, through the dielectric layer to expose a first subtractive via extending from the first metal level; and
    filling the first via opening with the second conductive material to form a first damascene via, in addition to the plurality of damascene vias, that is in contact with the first subtractive via.

19. The method of claim 15, wherein the plurality of subtractive vias is in a backside capacitor region, further comprising:
    forming a first subtractive via, in addition to the plurality of subtractive vias, in a backside-power-distribution-network (BSPDN) region; and
    forming a first damascene via, in addition to the plurality of damascene vias, in the BSPDN region,
    wherein the first damascene via extending from the second metal level to be in contact with the first subtractive via that extends from the first metal level.

20. The method of claim 15, wherein forming the semiconductor chip comprises:
    forming a device layer on top of a semiconductor substrate;
    forming a back-end-of-line (BEOL) structure on top of the device layer;
    bonding a carrier wafer onto a top surface of the BEOL structure; and
    removing the semiconductor substrate to expose the backside of the semiconductor chip.

* * * * *